(12) United States Patent
Petersson et al.

(10) Patent No.: US 7,804,358 B2
(45) Date of Patent: Sep. 28, 2010

(54) DEVICE WITH SHARED POWER AMPLIFIERS, FOR USE IN A WIRELESS TELECOMMUNICATIONS SYSTEM

(75) Inventors: Sven Petersson, Sävedalen (SE); Ulrika Engström, Floda (SE); Martin Johansson, Mölndal (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 12/300,527

(22) PCT Filed: May 19, 2006

(86) PCT No.: PCT/EP2006/004761

§ 371 (c)(1),
(2), (4) Date: Jul. 20, 2009

(87) PCT Pub. No.: WO2007/134615

PCT Pub. Date: Nov. 29, 2007

(65) Prior Publication Data

US 2009/0295474 A1    Dec. 3, 2009

(51) Int. Cl.
*H03F 3/68* (2006.01)

(52) U.S. Cl. .................. 330/124 R; 330/53; 330/295

(58) Field of Classification Search ............. 330/124 R, 330/53, 295
See application file for complete search history.

(56) References Cited

U.S. PATENT DOCUMENTS

| | | | |
|---|---|---|---|
| 6,157,811 A * | 12/2000 | Dent | 455/12.1 |
| 6,185,182 B1 | 2/2001 | Meredith | |
| 6,313,703 B1 * | 11/2001 | Wright et al. | 330/149 |
| 6,734,726 B2 * | 5/2004 | Billsberry | 330/52 |
| 6,744,314 B2 * | 6/2004 | Zhang et al. | 330/149 |
| 7,639,072 B2 * | 12/2009 | Sorrells et al. | 330/2 |
| 2009/0021301 A1 * | 1/2009 | Hellberg et al. | 330/124 R |

FOREIGN PATENT DOCUMENTS

| | | |
|---|---|---|
| EP | 0817309 A1 | 1/1998 |
| EP | 0924912 A1 | 6/1999 |
| WO | WO 98/08321 A | 2/1998 |

* cited by examiner

*Primary Examiner*—Patricia Nguyen

(57) ABSTRACT

A device with shared power amplifiers for use in a wireless telecommunication System. A plurality of input signals are tapered to alter the phase and/or amplitude distribution between the signals and are then distributed over the input ports of a plurality of power amplifiers. Power amplified replicas of the plurality of input signals are recreated at the output ports of the power amplifiers. The power amplified replicas of the signals are reverse tapered at an output of the device.

10 Claims, 9 Drawing Sheets

PRIOR ART

DEVICE WITH SHARED POWER AMPLIFIERS, FOR USE IN A WIRELESS TELECOMMUNICATIONS SYSTEM

TECHNICAL FIELD

The invention discloses a device for use in a wireless telecommunications system, and comprises a first plurality of power amplifiers, each power amplifier having an input and an output port.

The device of the invention also comprises means for distributing a second plurality of input signals over the input ports of said first plurality of power amplifiers, as well as means for recreating a power amplified replica of said second plurality of input signals at the output ports of said first plurality of power amplifiers, and there is a certain phase and amplitude relationship between the signals in said second plurality of input signals.

BACKGROUND

Multiple radio chains exist in almost all mobile radio communication systems, either per sector or per site. Normally, there is a unique power amplifier resource per transmission chain, and sometimes pooling of power amplifiers can be used to make an individual power amplifier available for several transmission chains.

Pooling of the power amplifier resource over a number of transmissions chains offers a number of potential advantages, such as graceful degradation and more efficient utilization of the resource, the latter being the focus of the present invention.

A pooled resource typically consists of three main blocks; an input matrix, power amplifiers (PA), and an output matrix. The matrixes are chosen such that the signal vector on the output ports of the output matrix is a power-amplified replica of the signal vector on the input ports of the input matrix.

The amplification is in general assumed to be equal for all of the power amplifiers in the pooled resource.

One frequently used realization of the input and output matrixes is the so-called Butler matrix. This matrix essentially performs a Discrete Fourier Transform (DFT). Other matrixes exist as well but these typically exhibit higher losses than a Butler matrix.

The (Butler) input matrix can be seen as a power divider which applies linear phase shifts over the output power divided signal vector. The magnitude of the phase shift depends on which input port is fed.

The power utilization of a pooled power amplifier resource depends on the characteristics of the signals to be amplified. If the signals are uncorrelated, each signal will be fed through all the power amplifiers with uniform power distribution over the PA-array. However, if the signals are correlated, or in fact identical except for a phase-shift and/or amplitude difference, the signals will not have a uniform power distribution over the PA-array.

The worst-case scenario, from a PA load-balancing scenario, is that all signals are fed through only one of the power amplifiers. In a steered beam system, the input signals are replicas of each other, except for a linear phase shift over the signal vector. For some steering angles, this phase shift causes the signals, after the input matrix, to flow via only one of the power amplifiers.

For most steering angles, signals are fed via all of the power amplifiers, however with a non-uniform power distribution. The power efficiency of the pooled amplifier is defined as the available output power for a given steering angle, when the power amplifier with the highest load delivers maximum output power, over the maximum output power per PA times the number of PA:s. The power efficiency will depend on the steering angle, but on the average is quite low.

If several independent signals are fed simultaneously via the pooled resource, as is the case with simultaneous users in the cell, the power efficiency will of course be higher due to averaging over user equipment locations.

An obvious solution to the problem of having non-uniform power distribution over the array is to place the power amplifiers in element space. However, in some applications it is desired to have the power amplifiers elsewhere than in element space, as will be discussed below.

One example of such an application is the case where the PA resource is used for transmission of either one data stream over a 4-element antenna array or two data streams over two 2-element arrays or four data streams over four single element antennas. As the power amplifiers are located in element space, i.e. at the antenna ports, the power efficiency becomes low, 0.5, for any data stream scenario since only half of the power amplifiers will be in use for a certain transmission scheme.

If the power amplifier resource is instead pooled with the aid of input/output matrixes, the power efficiency is improved to 1.0 for the transmission of 4 data streams, while it is reduced down to 0.25 for the single stream for the worst steering angles.

SUMMARY

Thus, one purpose of the present invention is to provide a power efficient utilization of a pooled power amplifier resource in a transmitter in a wireless telecommunications system.

This purpose is achieved by the present invention in that it discloses a device for use in a wireless telecommunications system, the device comprising a first plurality of power amplifiers, each power amplifier having an input and an output port, and means for distributing a second plurality of input signals over the input ports of said first plurality of power amplifiers.

The device of the invention also comprises means for recreating a power amplified replica of said second plurality of input signals at the output ports of said first plurality of power amplifiers. There is a certain phase and amplitude distribution between the signals in said second plurality of input signals and the device additionally comprises tapering means being arranged to alter the phase and/or amplitude distribution of the input signals before they are input to the distribution means, as well as means for reverse tapering at the output of the device.

In a preferred embodiment, the device additionally comprises means for creating the phase and/or amplitude distribution between the input signals before they are input to the tapering means.

The tapering means alter the phase and/or amplitude distribution of the signals which are input to it as a function of the phase and/or amplitude distribution between the signals that are input to the tapering means.

The advantages of the invention will become more evident by means of the following detailed description, and also with the aid of the appended drawings.

BRIEF DESCRIPTION OF THE DRAWINGS

The invention will be described in more detail in the following with reference to the appended drawings, in which.

DETAILED DESCRIPTION

Figure 1:
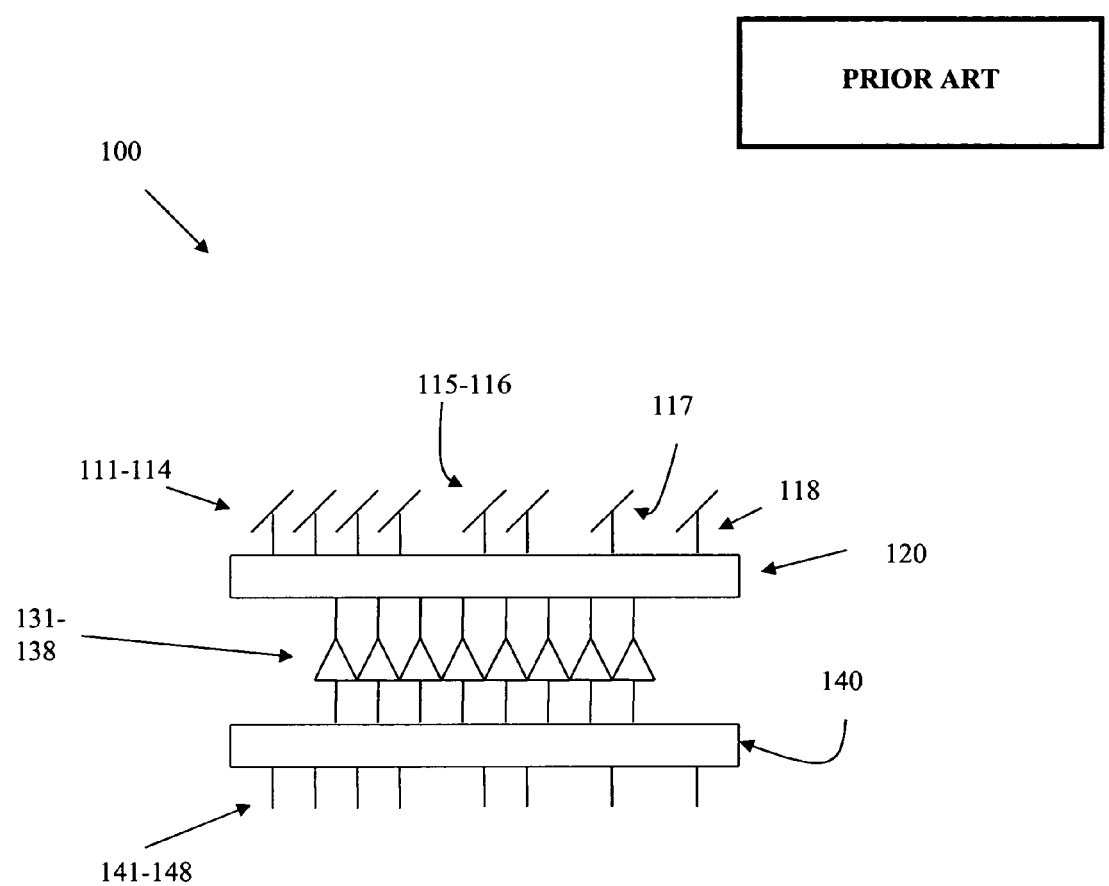
FIG. 1 shows a first device according to prior art, the device having input and output matrixes.

FIG. 1 shows a known transmitter 100 for use in a wireless telecommunications system. The transmitter 100 comprises a first plurality of power amplifiers 131-138, and each of the power amplifiers 131-138 has an input and an output port. Each of the power amplifiers is typically part of a transmitter chain.

The known transmitter 100 is also equipped with an input matrix 140 for distributing a plurality of input signals 141-148 over the input ports of the power amplifiers 131-138. The purpose of the input matrix 140 is to divide the input signals 141-148 over the power amplifiers, so that the power amplifiers may be pooled between the radio chains.

However, since the input signals 141-148 are distributed over the power amplifiers 131-138, they need to be recreated as individual but amplified signals before they are transmitted by the transmitter 100 over the antennas 111-118 to which the transmitter is connected. For this purpose, the transmitter 100 is also equipped with an output matrix 120, which as input receives the outputs of the power amplifiers, and as its output delivers the individual signals which were input to the input matrix 140, the individual signals now being amplified.

In the continued description in this document, it will be assumed that Butler matrixes are used as input/output matrixes in the transmitters which will be described, as is also the case with the transmitter 100. However, to those skilled in the art, it will be obvious that such a matrix is only one of many possible matrixes which may be used to the same effect.

Returning now to the known transmitter 100 in FIG. 1, there may also be a certain phase and amplitude distribution between the input signals 141-148. The phase distribution can be "zero", i.e. the signals are all in phase, but a common case is that there is a linear phase distribution between the signals, in order to achieve beam steering of the beams which are output by the antennas 111-118. The antennas 111-118 of the transmitter in FIG. 1 are arranged to output 4, 2 or 1 data streams over 4, 2 or 1 antennas respectively.

Figure 2:
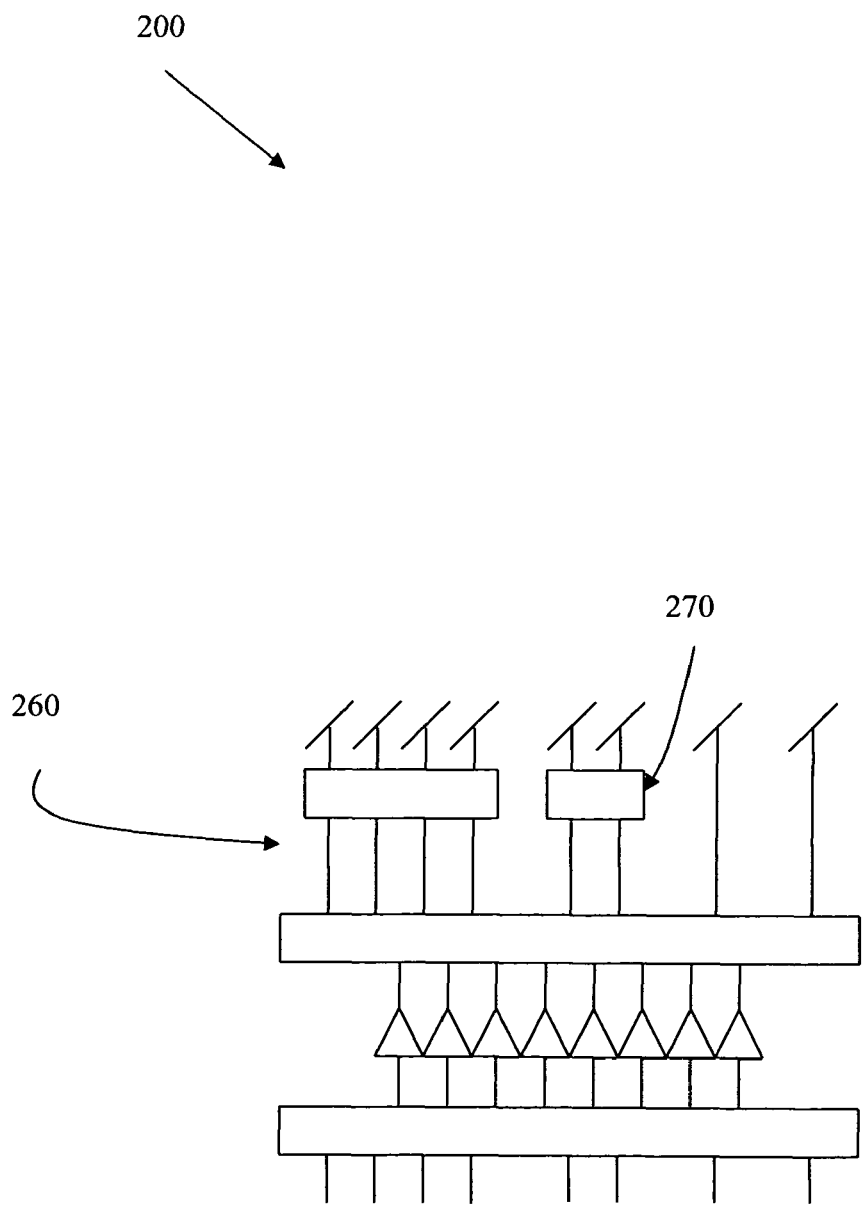
FIG. 2 shows a second device according to prior art, the device comprising input and output matrixes and beam forming networks.

FIG. 2 shows another known transmitter 200. The known transmitter 200 is similar to the transmitter 100 of FIG. 1, but is also equipped with beam forming networks 260, 270, at two sub-sets of the antennas.

The combination of input signals to the transmitter with a certain phase and amplitude distribution between them, and a distribution network (the input matrix) to the power amplifiers may give rise to unfortunate combinations when it comes to utilizing the power amplifiers. This is particularly the case when there is a linear phase distribution between the input signals, which is usually the case when beam steering is desired.

Figure 3:
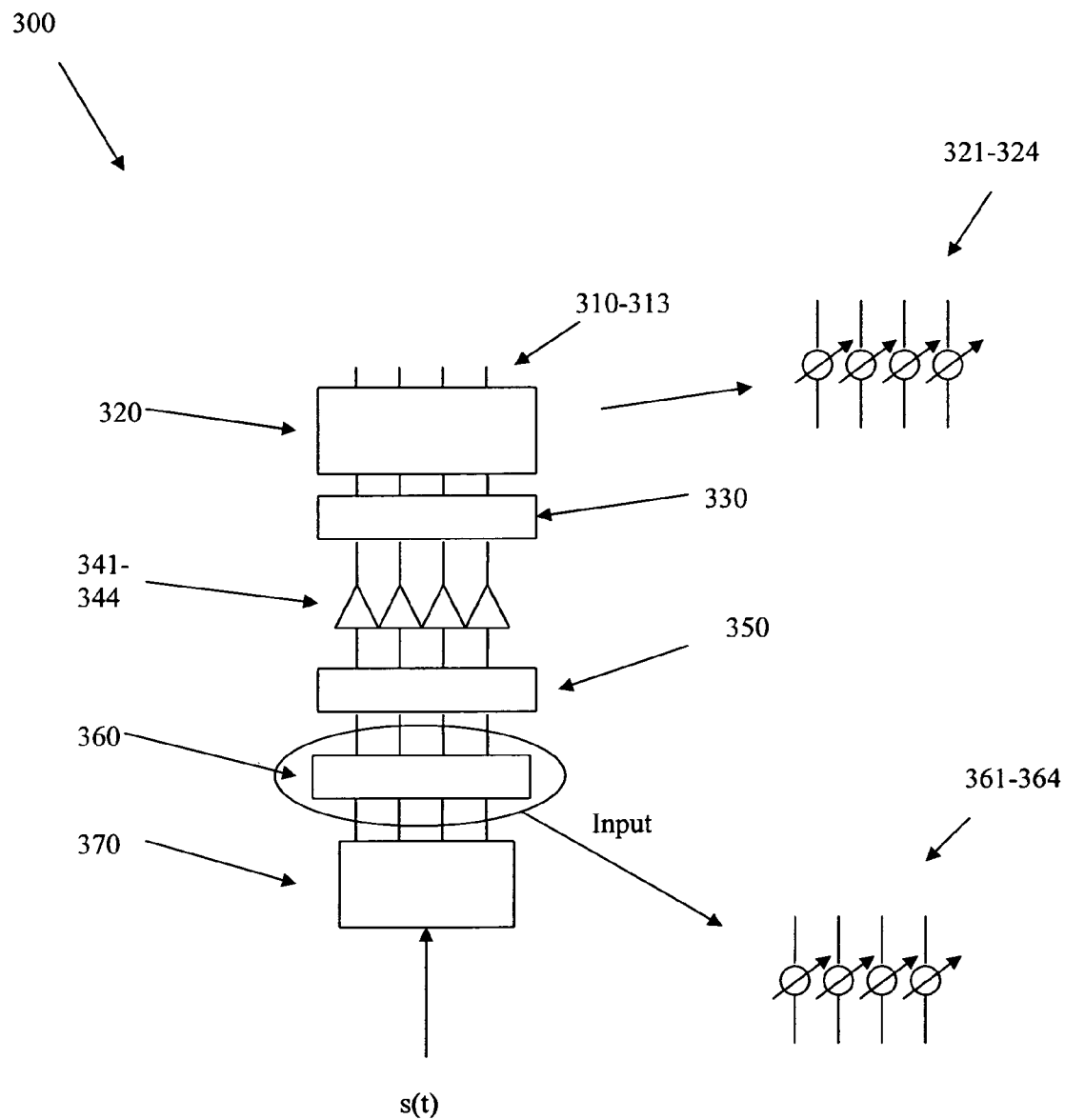
FIG. 3 shows a first embodiment of a device of the invention.

FIG. 3 shows a first embodiment 300 of a transmitter of the invention, intended to overcome some of the disadvantages of the prior art mentioned above. In similarity to the transmitters 100 and 200 of FIGS. 1 and 2, the device 300 comprises a first plurality of power amplifiers 341-344, with each power amplifier having an input and an output port. The device 300 also comprises an input matrix 350 for distributing a second plurality of input signals over the input ports of the power amplifiers 341-344.

In addition, as was also shown with the previous transmitters 100 and 200, the device 300 is equipped with an output matrix 330 for recreating the input signals when they are output at the output ports of the power amplifiers.

However, as opposed to previously known transmitters, the device 300 of the invention also comprises tapering means 360 connected to the inputs of the input matrix 350. One function of the tapering means 360 is to alter the phase and/or amplitude distribution of the input signals before they are input to the input matrix 350, in order to avoid or reduce undesired combinations of phase positions and amplitude variations at the outputs of the input matrix 350, in other words at the inputs to the power amplifiers 341-344.

The tapering means 360 are also shown separately in FIG. 3, where they are depicted as a group of controllable phase shifters 361-364. As those skilled in the field will appreciate, phase shifting of signals can be achieved in a variety of well known ways. The tapering means will in the following, for the sake of clarity, be described as only altering the phase distribution of the input signals before they are input to the input matrix 350. However, it should be clearly understood that this is only so as not to obscure the description, the tapering means can, as explained above, also be applied to the amplitude relationship between the signals, or to a combination of the phase and amplitude relationship. This comment is equally applicable to the "reverse tapering means" which will be described in the following.

The device 300 of the invention also comprises means 320 for "reverse tapering" at the output of the device, i.e. at the outputs of the output matrix 330. The phrase "reverse tapering" means that the altering of the phase distribution which was carried out by the tapering means 360 at the inputs to the input matrix 350 is reversed by this function. In FIG. 3, the means for reverse tapering 320 are shown as a group of controllable phase shifters 321-324.

Also shown in FIG. 3 is a function or means 370 for input control. These means can either be part of the device 300, or be a separate device to which the device is connected. The input control serves to give a signal s(t) the phase properties which are desired at the outputs of the device 300. If the signal s(t) is input as a single signal only, as shown in FIG. 3, the input control 370 will split the signal s(t) into a plurality of signals, with the desired phase differences between said signals.

Figure 4:
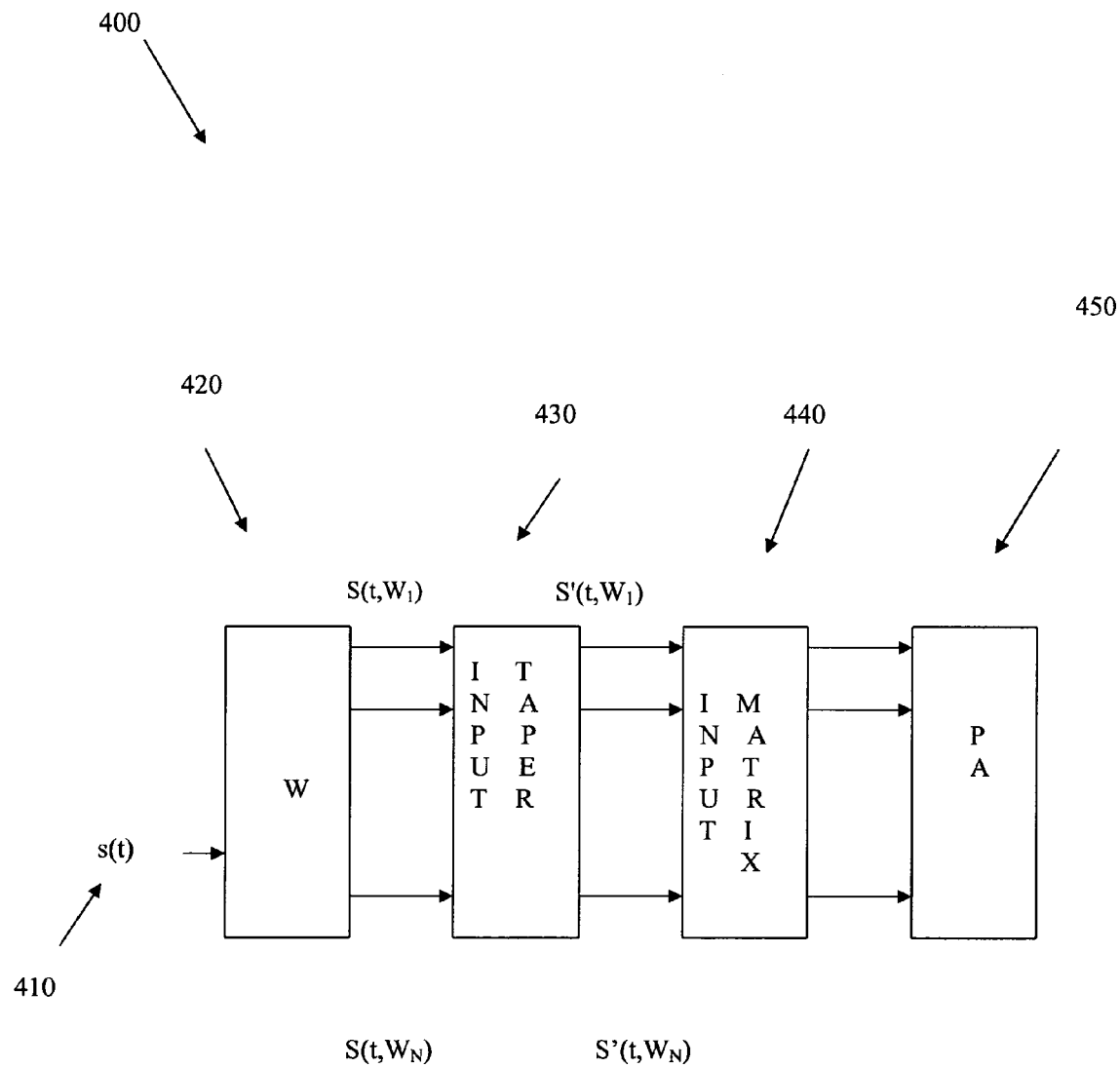
FIG. 4 shows a more detailed block diagram of the device of FIG. 3, and FIGS. 5 and 6 show a diagram of improvements obtained with the invention of FIGS. 3 and 4.

FIG. 4 shows a device 400 of the invention up to, and including, the power amplifiers 450. Thus, the following is shown in the device 400 in FIG. 4: an input signal s(t) 410, an input control block W 420, an input taper block 430, an input matrix 440 and a plurality of power amplifiers 450.

As has been explained previously, the input control block W serves, where applicable, to split an incoming signal s(t) into a desired amount of output signals, $s(t, W_1), s(t, W_2) \ldots s(t, W_N)$, and also to cause phase differences between said output signals. The signals which are output from the input control 420 are used as input to the taper function 430, and the taper function 430 serves to alter the phase distribution (phase differences) of the signals before they are input to the input matrix 440.

Thus, both the input control and the phase taper alter the phase differences between the signals which are input to them. Suitably, the alterations which are carried out by the taper function are a function of the phase differences between the signals which are input to it, so that undesired combinations of phase differences of signals in to the matrix are avoided.

All of the possible combinations between phase shifts in the input control 420 and the phase shifts caused by the input taper can not, as will be realized, be listed here. However, the input taper function 430 can use a look-up table or a computation means in order to see/calculate which phase differences that should be applied to the input signals before they are output to the input matrix in order to avoid unfortunate combinations of phase differences.

Said look-up table or computation function could use a separate data input from the input function 420 regarding the phase differences which are applied to the signals by the input block, or as an alternative, can simply measure the phase differences between the signals which are input to the taper function.

Said look-up table or computation function could be designed to function according to the following principle: Will the phase differences between the signals which are input to the taper function 430 cause a signal distribution after the input matrix which will give rise to a power efficiency (use of the PA:s) which is below a certain threshold?

If the answer to the question is YES, then let the taper function give rise to a phase distribution between the signals which will cause a power efficiency which is at least above said threshold.

Figure 5:
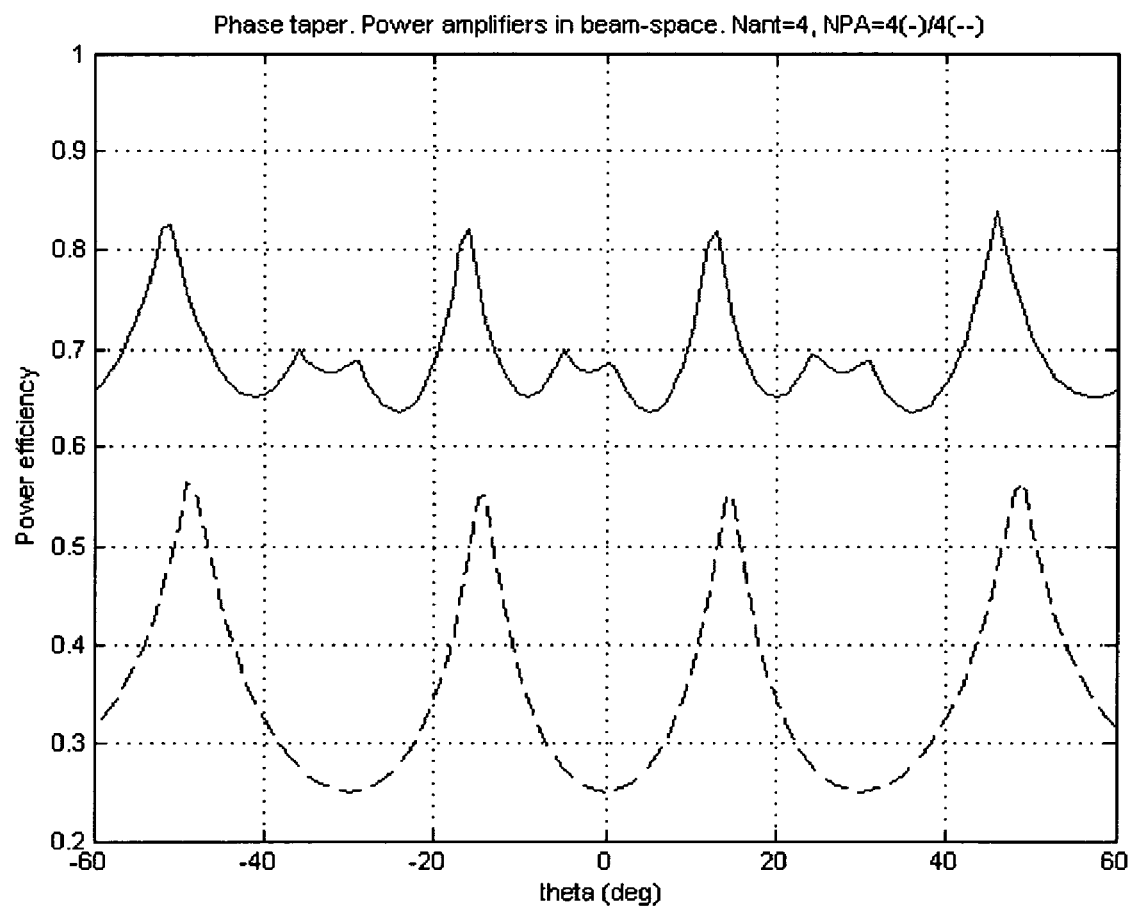

FIG. 5 shows a diagram of the power efficiency for the device shown in FIG. 3, with and without the taper and reverse taper functions, respectively, in an application where the device of FIG. 3 feeds an array antenna. The vertical axis is the power efficiency and the horizontal axis is the scan angle of the steered beam of the system.

The top curve in FIG. 5 is the power efficiency with the taper and reverse taper function of the invention, and the bottom curve is the power efficiency without these functions. The phase shift caused by the phase taper function 360 for the four input signals are, from left to right in FIG. 3: 0, 100, 95 and 350 degrees.

Figure 6:
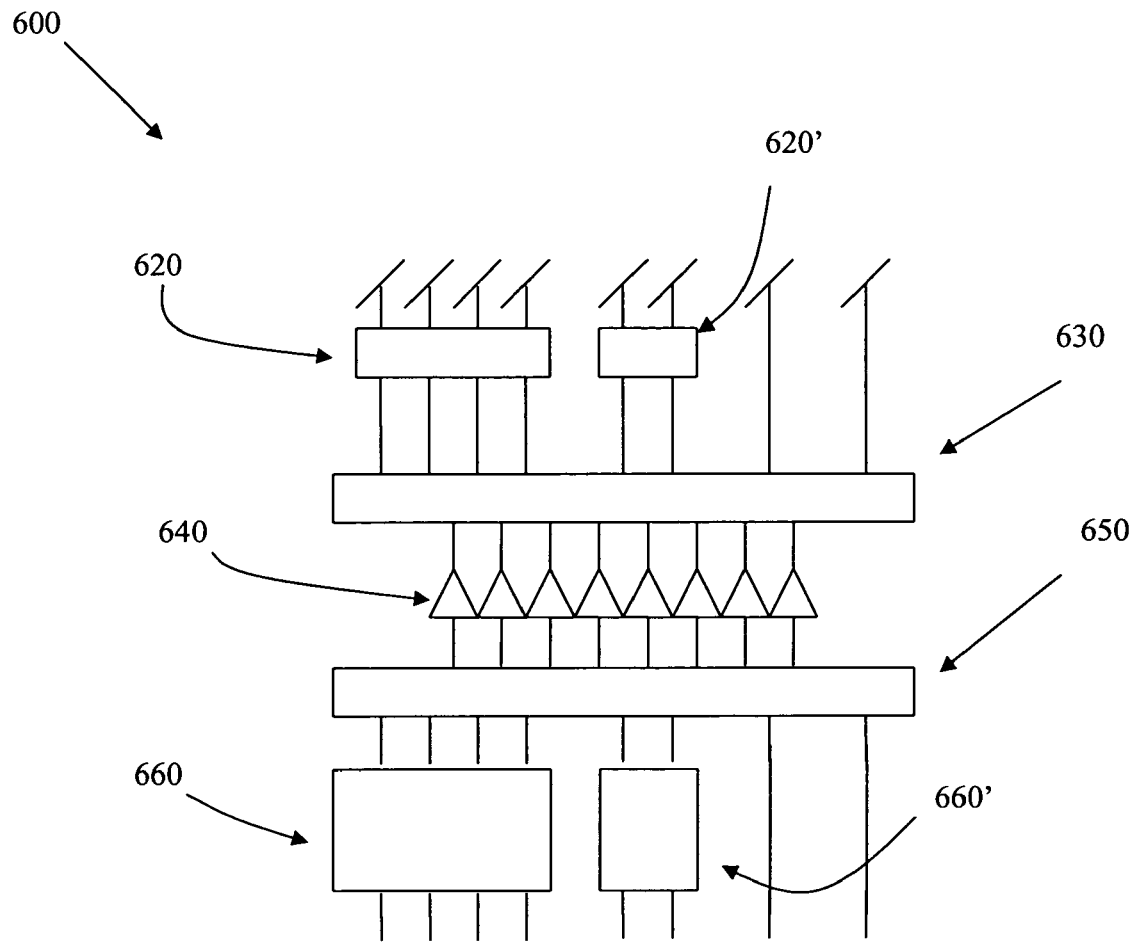

FIG. 6 shows a version of the device from FIG. 2, but here equipped with input 660, 660', and output 620, 620', taper functions. Apart from the taper functions, the device 600 comprises PA:s 640, an input matrix 650 and an output matrix 630. As can be seen, the taper and reverse taper functions are only connected to four of the inputs/outputs of the device. Naturally, the number four is only an example, the taper and reverse taper functions can be applied to any subset of the total amount of inputs/outputs of the device.

Figure 7:
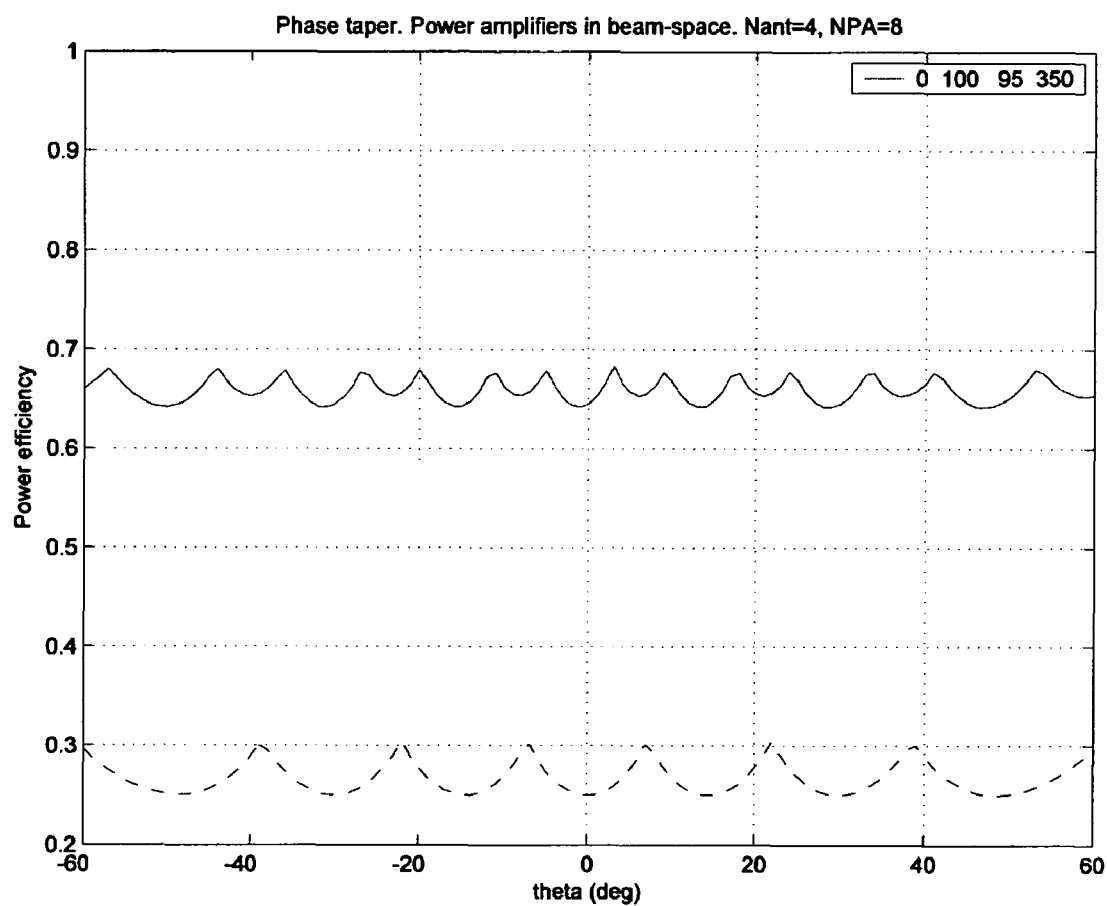
FIG. 7 shows a second embodiment of the device of the invention.

FIG. 7 shows a diagram of the power efficiency of the device 600 shown in FIG. 6, with and without the taper and reverse taper functions, respectively. The vertical axis is the power efficiency and the horizontal axis is the azimuth angle of the steered beam from the system.

The top curve in FIG. 7 is the power efficiency of the input block 660 with the taper and reverse taper function of the invention, and the bottom curve is the power efficiency of that input block without these functions. The phase shift caused by the phase taper function 660 for the four input signals are, from left to right in FIG. 6: 0, 100, 95 and 350 degrees.

Figure 8:
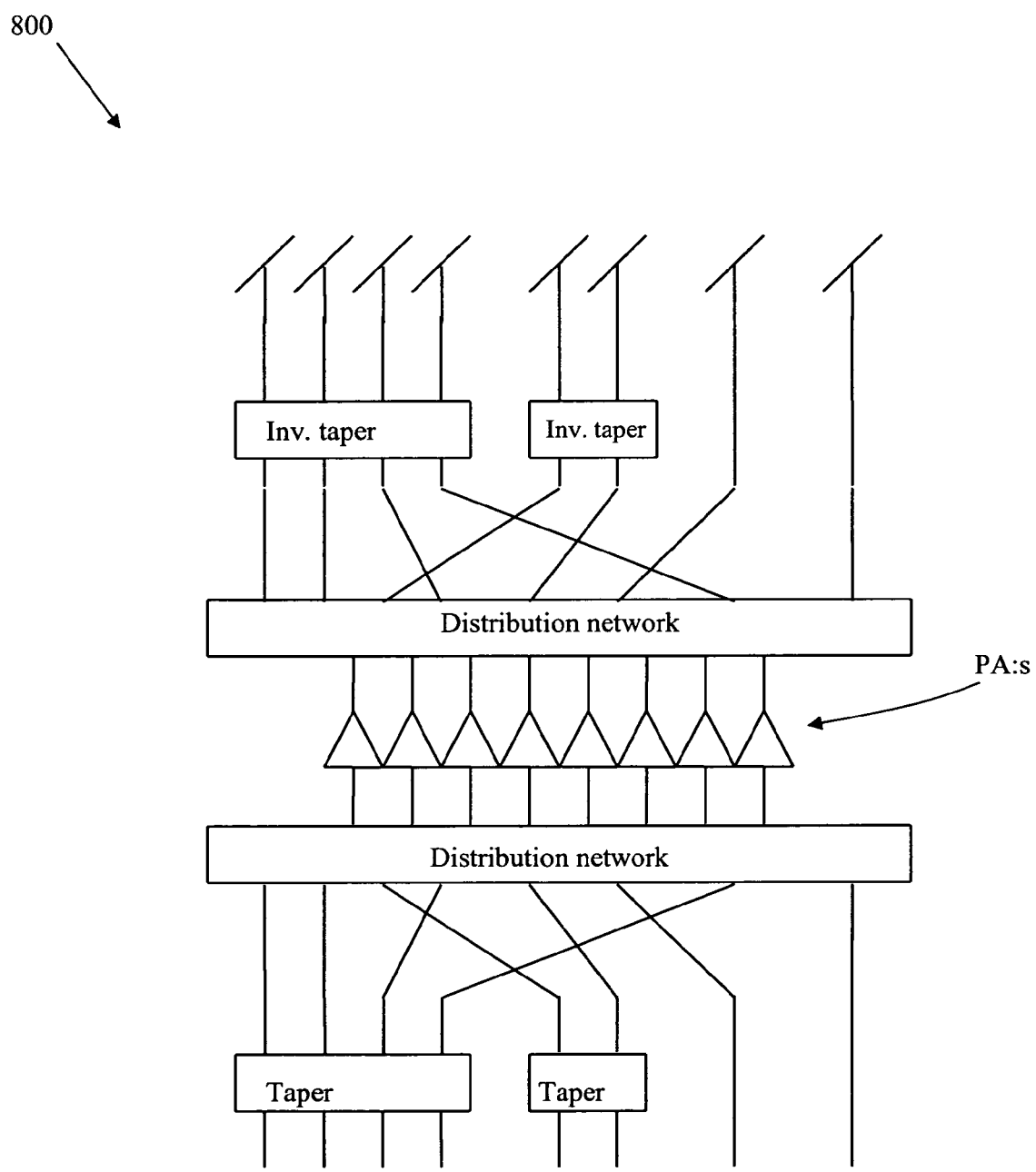
FIG. 8 shows a version of the device of FIG. 6.

The phase taper function thus serves to de-correlate the phase differences so as to avoid non-beneficial phase differences between the signals from the input matrix, which leads to an increase in the power efficiency of the device. FIG. 8 shows another way of de-correlating the phase differences between the signals from the input matrix: the device 800 shown in FIG. 8 is similar to the device 600 shown in FIG. 6, with one difference, the use of non-consecutive ports from the outputs of the phase taper function to the input matrix. In other words, output ports 1-N of the phase taper function are not connected consecutively to the input ports of the input matrix. As can be realized, the non-consecutive use of ports will also lead to a de-correlation of the phase differences of the signals input to the input matrix.

Figure 9:
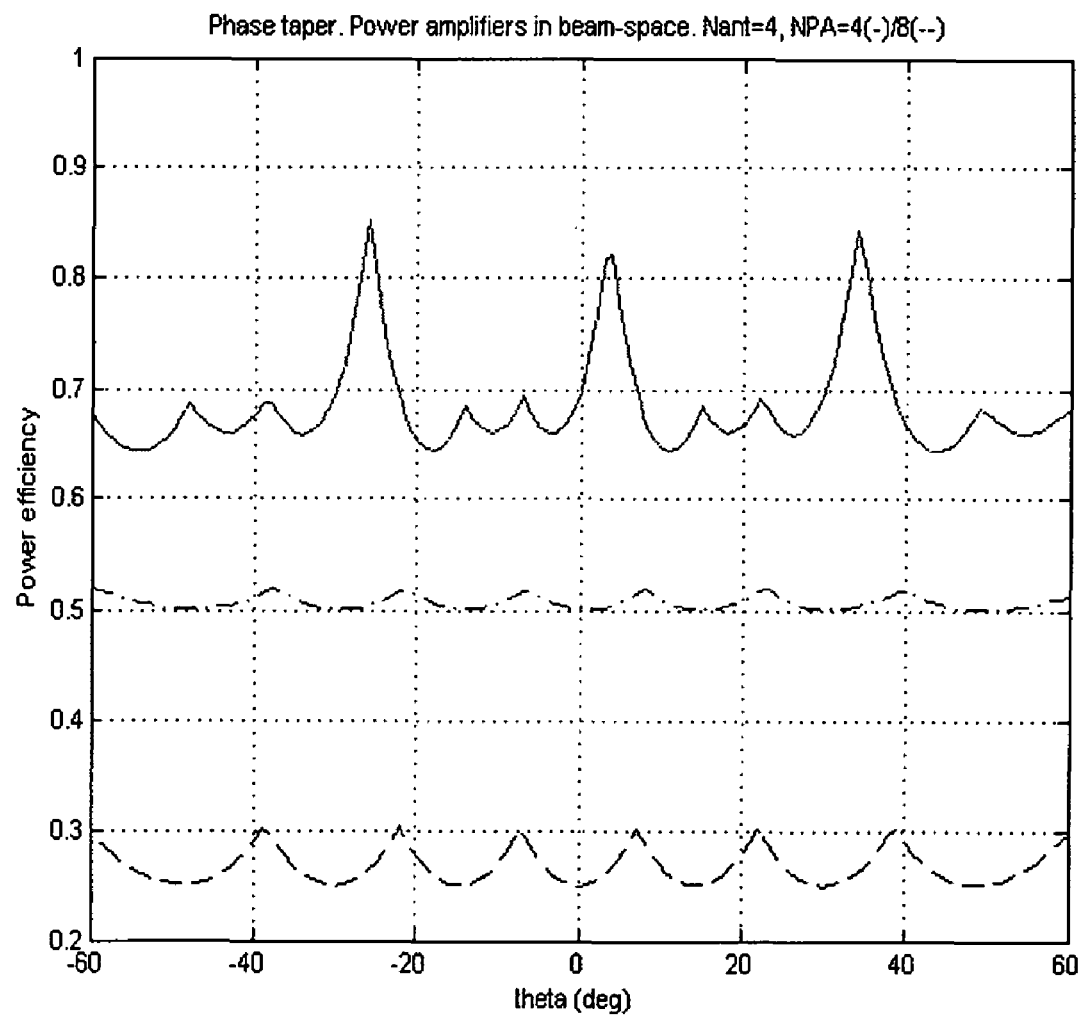
FIG. 9 shows a diagram of power efficiency.

FIG. 9 shows a diagram of the power efficiency for non-consecutive use of ports, with (top curve) and without (middle curve) phase taper for a steered beam system. For reference, the case of consecutive ports without phase taper is shown, (bottom curve). The increase in power efficiency is significant, since the destructive interaction between the linear phase fronts for the steered beams and the linear phase shifts in the input matrix to the pooled resource is reduced.

The invention is not limited to the examples of embodiments shown above, but may be freely varied within the scope of the appended patent claims. One example of such a variation is that the number of input signals can also be smaller than the number of power amplifiers.

In the claims, as well as in the embodiments described above, the input signals are subjected to a tapering (and subsequent reverse tapering) of their phase and/or amplitude relationship. It should be pointed out that the signals can also be subjected to a relatively large "time delay" taper, which is to be understood as being included in the term "phase taper" in this text.

Also, in the examples of embodiments shown and described above, the taper (and consequently the reverse taper) function has been "fixed". It is also perfectly feasible within the scope of the invention to have an adaptive taper and reverse taper functionality. By means of such a functionality, the incoming signals (or a sub-set of those signals) would be analyzed in order to arrive at an optimized taper and reverse taper function, with regard to the tapering and reverse tapering that is to be carried out, and the taper reverse taper functions would then be set for said optimized function.

As a further alternative, the taper and reverse taper functions can be adaptive, but based on a priori information regarding the input signals, said information being received by the device of the invention, for example, from the system.

The invention claimed is:

1. A device for use in a wireless telecommunications system, said device comprising:
   a plurality of power amplifiers, each power amplifier having an input and an output port;
   means for receiving a plurality of input signals having a phase and amplitude distribution between the signals;
   tapering means for altering the phase or amplitude distribution of the input signals as a function of the phase and amplitude distribution;
   means for distributing the plurality of tapered input signals over the input ports of the plurality of power amplifiers;
   means for recreating power amplified replicas of the plurality of input signals at the output ports of the plurality of power amplifiers; and
   means for reverse tapering the power amplified replicas at an output of the device.

2. The device of claim 1, further comprising means for applying the phase and amplitude distribution between the input signals before they are input to the tapering means.

3. The device of claim 1, wherein the tapering means comprises controllable phase shifters.

4. The device of claim 1, wherein the tapering means and the inverse tapering means are applied only to a subset of the input and output ports of the plurality of power amplifiers.

5. The device of claim 1, wherein the number of input signals is equal to the number of power amplifiers.

6. The device of claim 1, wherein the number of input signals is less than the number of power amplifiers.

7. A method of optimizing power utilization in a power amplification device in a wireless telecommunications system, wherein the device includes a plurality of power amplifiers, each of the power amplifier having an input and an output port, the method comprising the steps of:

receiving a plurality of input signals having a phase and amplitude distribution between the signals;

tapering the input signals by altering the phase or amplitude distribution of the input signals as a function of the phase and amplitude distribution;

distributing the plurality of tapered input signals over the input ports of the plurality of power amplifiers;

recreating power amplified replicas of the plurality of input signals at the output ports of the plurality of power amplifiers; and reverse tapering the power amplified replicas at an output of the device.

8. The method of claim 7, wherein the tapering step and the reverse tapering step are applied only to a subset of the input and output ports of the plurality of power amplifiers.

9. The method of claim 7, wherein the number of input signals is equal to the number of power amplifiers.

10. The method of claim 7, wherein the number of input signals is less than the number of power amplifiers.

* * * * *